United States Patent
Jiang

(10) Patent No.: US 9,754,909 B2
(45) Date of Patent: Sep. 5, 2017

(54) COPPER STRUCTURES WITH INTERMETALLIC COATING FOR INTEGRATED CIRCUIT CHIPS

(71) Applicant: Monolithic Power Systems, Inc., San Jose, CA (US)

(72) Inventor: Hunt Hang Jiang, Saratoga, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 14/944,054

(22) Filed: Nov. 17, 2015

(65) Prior Publication Data

US 2016/0351520 A1 Dec. 1, 2016

Related U.S. Application Data

(60) Provisional application No. 62/166,567, filed on May 26, 2015.

(51) Int. Cl.
*H01L 21/44* (2006.01)
*H01L 23/00* (2006.01)

(52) U.S. Cl.
CPC .............. *H01L 24/13* (2013.01); *H01L 24/11* (2013.01); *H01L 2224/03462* (2013.01);
(Continued)

(58) Field of Classification Search
CPC . H01L 2224/11848; H01L 2224/03462; H01L 2224/03464; H01L 2224/03824; H01L 2224/03825; H01L 2224/11462; H01L 2224/11464; H01L 2224/11825; H01L 2224/11826; H01L 2224/27462; H01L 2224/27464; H01L 2224/27825; H01L 2224/35125; H01L 2224/35825; H01L 2224/43125; H01L 2224/43825; H01L 2224/75189; H01L 2224/26; H01L 2224/80801; H01L 2224/80815; H01L 2224/81801; H01L 2224/81815; H01L 2224/82801; H01L 2224/82815; H01L 2224/83801; H01L 2224/83815; H01L 2224/84801; H01L 2224/84815; H01L 2224/85801; H01L 2224/85815; H01L 2224/86801; H01L 2224/86815; H01L 24/11; H01L 24/13; H01L 2924/01013; H01L 2924/01029; H01L 2924/0105;
(Continued)

(56) References Cited

U.S. PATENT DOCUMENTS

| 5,310,602 A * | 5/1994 | Li ..................... H01L 21/76838 257/E21.582 |
| 8,264,077 B2 * | 9/2012 | Chiou ................. H01L 21/6835 257/698 |

(56) References Cited

| 2006/0087034 A1 * | 4/2006 | Huang .................... H01L 24/13 257/737 |
| 2007/0145584 A1 * | 6/2007 | Kataoka ................... C25D 5/02 257/736 |
| 2008/0073792 A1 * | 3/2008 | Hosseini ................. H01L 24/03 257/762 |
| 2008/0258299 A1 * | 10/2008 | Kang ...................... H01L 24/83 257/737 |
| 2010/0140805 A1 * | 6/2010 | Chang ................ H01L 21/6835 257/773 |
| 2010/0309641 A1 * | 12/2010 | Hata ...................... H01L 21/563 361/783 |
| 2011/0304049 A1 * | 12/2011 | Shigihara .......... H01L 23/53238 257/762 |

(Continued)

*Primary Examiner* — Teresa M Arroyo
(74) *Attorney, Agent, or Firm* — Okamoto & Benedicto LLP

(57) ABSTRACT

An integrated circuit (IC) chip includes a copper structure with an intermetallic coating on the surface. The IC chip includes a substrate with an integrated circuit. A metal pad electrically connects to the integrated circuit. The copper structure electrically connects to the metal pad. A solder bump is disposed on the copper structure. The surface of the copper structure has a coating of intermetallic. The copper structure can be a redistribution layer and a copper pillar that is disposed on the redistribution layer.

8 Claims, 12 Drawing Sheets

(52) U.S. Cl.
CPC .............. *H01L 2224/03464* (2013.01); *H01L 2224/03825* (2013.01); *H01L 2224/11848* (2013.01); *H01L 2224/80801* (2013.01); *H01L 2224/80815* (2013.01); *H01L 2924/014* (2013.01); *H01L 2924/0105* (2013.01); *H01L 2924/01013* (2013.01); *H01L 2924/01029* (2013.01)

(58) Field of Classification Search
CPC ......... H01L 2924/014; H01L 21/76873; H01L 21/76874; H01L 23/488; H01L 2021/60007; H01L 2021/60097
USPC .... 438/612, 660, 687, FOR. 274, FOR. 358, 438/FOR. 390
See application file for complete search history.

(56) References Cited

U.S. PATENT DOCUMENTS

| | | | |
|---|---|---|---|
| 2012/0091577 A1* | 4/2012 | Hwang | H01L 24/11 257/737 |
| 2015/0255413 A1* | 9/2015 | Harper | H01L 24/14 257/737 |
| 2015/0262953 A1* | 9/2015 | Lee | H01L 24/13 257/737 |

\* cited by examiner

COPPER STRUCTURES WITH INTERMETALLIC COATING FOR INTEGRATED CIRCUIT CHIPS

REFERENCE TO RELATED APPLICATION

This application claims the benefit of U.S. Provisional Application No. 62/166,567, filed on May 26, 2015, which is incorporated herein by reference in its entirety.

BACKGROUND OF THE INVENTION

1. Field of the Invention

The present invention relates generally to electrical circuits, and more particularly but not exclusively to copper structures of integrated circuit chips.

2. Description of the Background Art

An integrated circuit (IC) chip includes input/output (I/O) pads that are electrically connected to electrical circuits of the IC chip. The I/O pads can be wire-bonded to pins of the IC chip packaging. An I/O pad can also be connected to a redistribution layer, which is an additional metal layer that makes the I/O pad available in another location of the IC chip. The redistribution layer is electrically connected to a solder bump, which allows the IC chip to be electrically connected to an external electrical circuit, such as another IC chip.

SUMMARY

In one embodiment, an integrated circuit (IC) chip includes a copper structure with an intermetallic coating on the surface. The IC chip includes a substrate with an integrated circuit. A metal pad electrically connects to the integrated circuit. The copper structure electrically connects to the metal pad. A solder bump is disposed on the copper structure. The surface of the copper structure has a coating of intermetallic. The copper structure may comprise a redistribution layer and a copper pillar that is disposed on the redistribution layer.

These and other features of the present invention will be readily apparent to persons of ordinary skill in the art upon reading the entirety of this disclosure, which includes the accompanying drawings and claims.

The use of the same reference label in different figures indicates the same or like components. The figures are not drawn to scale.

DETAILED DESCRIPTION

In the present disclosure, numerous specific details are provided, such as examples of materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
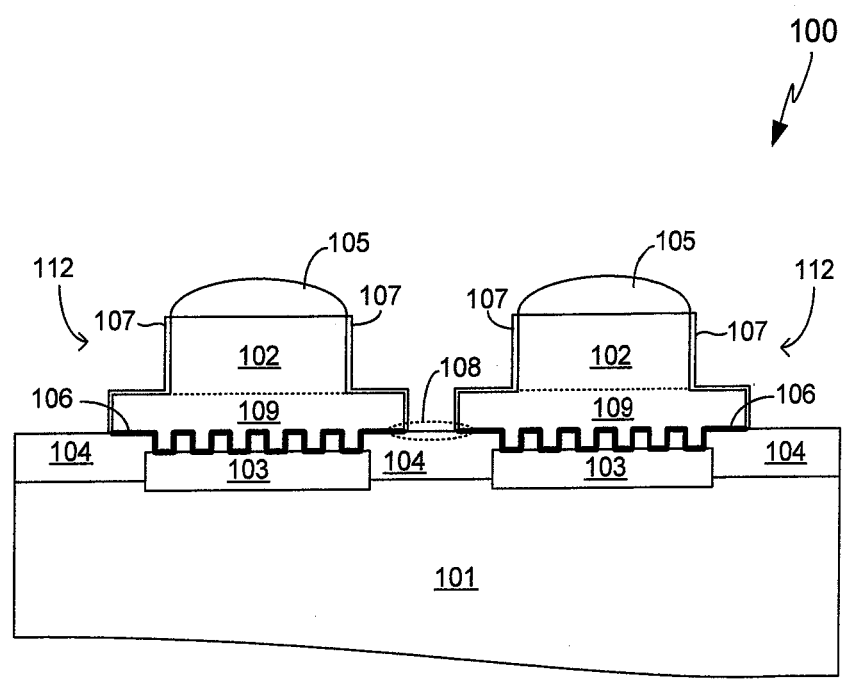
FIG. 1 shows a cross-section of a portion of an integrated circuit (IC) chip in accordance with an embodiment of the present invention.

FIG. 1 shows a cross-section of a portion of an IC chip 100 in accordance with an embodiment of the present invention. The IC chip 100 may comprise a substrate 101, which comprises an integrated circuit. Electrical circuits fabricated in the substrate 101 may be connected to an electrical circuit external to the IC chip 100 by way of a plurality of metal pads 103. In one embodiment, a metal pad 103 (e.g., aluminum) is an I/O pad of the IC chip 100. A metal pad 103 is also referred to as a "bond pad" because it may be connected to a pin of the IC chip 100 by wire bonding. In the example of FIG. 1, a metal pad 103 is electrically connected to a redistribution layer 109.

In the example of FIG. 1, the IC chip 100 includes a passivation layer 104 (e.g., silicon nitride) that is disposed on the substrate 101. In one embodiment, the passivation layer 104 includes a plurality of micro-vias for a single metal pad 103. The micro-vias expose the metal pad 103 to allow a redistribution layer 109 to be electrically connect to the metal pad 103. A copper pillar 102 is disposed on and electrically connects to a redistribution layer 109, and a solder bump 105 (e.g., tin) is disposed on and electrically connects to the copper pillar 102. In this example, the resulting structure is a tin/copper pillar bumped flip-chip die. The flip-chip die can be packed on to a packaging platform, such as a leadframe and packaging substrate, to form an IC package. In general, an external electrical circuit, such as another IC chip, may be electrically connected to electrical circuits in the substrate 101 by way of the electrical connection provided by the solder bump 105, the copper pillar 102, the redistribution layer 109, the copper seed layer 106, and the metal pad 103.

In the example of FIG. 1, a copper structure 112 comprises a redistribution layer 109 and a copper pillar 102, which both comprise copper. The copper pillar 102 is narrower than the redistribution layer 109. The copper pillar 102 and the redistribution layer 109 may be formed in separate copper electroplating processes. In one embodiment, the copper structure 112 is covered by a coat of an intermetallic 107. The coat of intermetallic 107 advantageously prevents copper migration between adjacent copper structures 112. During packaging, the IC chip 100 is encapsulated with a molding compound (not shown) that fills the gaps between the copper structures 112. The intermetallic coating 107 prevents the tendency of copper ions to migrate between adjacent copper structures 112 along the interface (see generally 108) between the passivation layer 104 and the molding compound. With a solder bump 105 that comprises tin, the intermetallic coating 107 may comprise a tin-copper (Sn—Cu) intermetallic, such as Cu3Sn. It is to be noted that one or more copper redistribution traces (not shown) may be running between copper structures 112. These copper redistribution traces may have corresponding micro-vias underneath that connect to corresponding metal pads 103.

FIGS. 2-12 show cross-sections of the IC chip 100 during manufacture in accordance with an embodiment of the present invention. FIGS. 2-12 show the IC chip 100 during the wafer assembly and test portion of the IC chip 100 manufacturing process. FIGS. 2-12 show the manufacture of a single copper structure 112 for clarity of illustration. As can be appreciated, the IC chip 100 may include a plurality of copper structures 112. Accordingly, although FIGS. 2-12 show a single redistribution layer 109, copper pillar 102, and solder bump 105, the manufacturing process involves formation of a plurality of redistribution layers 109, copper pillars 102, solder bumps 105, etc.

Figure 2:
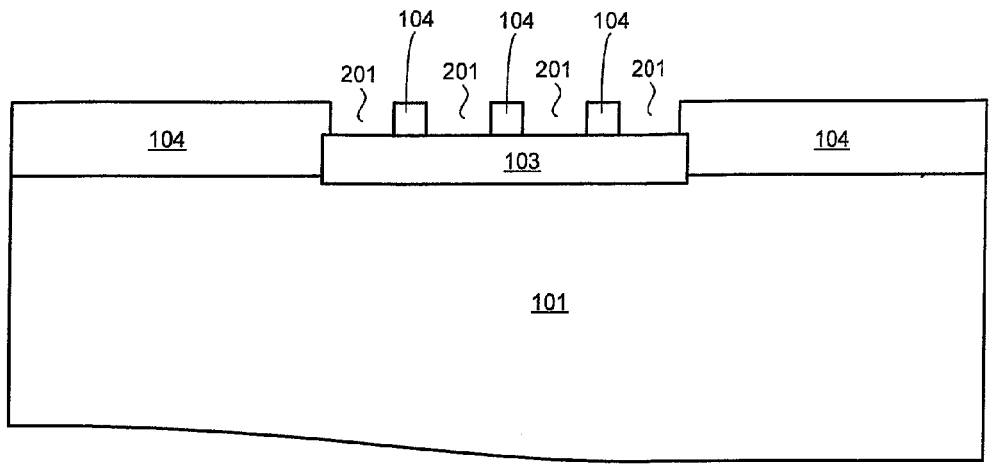
FIGS. 2-12 show cross-sections of the IC chip of FIG. 1 during manufacture in accordance with an embodiment of the present invention.

Referring first to FIG. 2, there is shown a metal pad 103 formed on the substrate 101. In one embodiment, the metal pad 103 comprises aluminum. The metal pad 103 may be an I/O pad that is electrically connected to an electrical circuit in the substrate 101 (i.e., an integrated circuit). The electrical circuits in the substrate 101 may be formed during the wafer fabrication portion of the IC chip 100 manufacturing process, which precedes wafer assembly and test.

In the example of FIG. 2, a passivation layer 104 is formed over the substrate 101. The passivation layer 104 may comprise, for example, a silicon nitride/silicon oxide stack, with the silicon oxide being formed on the substrate 101 and the silicon nitride being formed on the silicon oxide. For a single metal pad 103, a plurality of micro-vias 201 is formed through the passivation layer 104. A micro-via 201 may be a 3 μm×3 μm or a 3 μm×6 μm via, for example.

Figure 3:
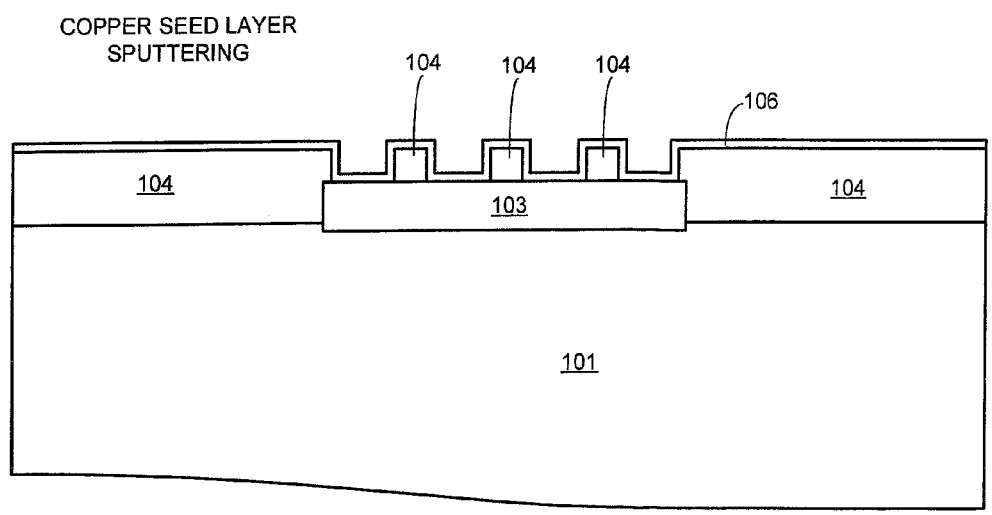

In the example of FIG. 3, a copper seed layer 106 is formed over the substrate 101. The copper seed layer 106 may be sputtered on the passivation layer 104 and on surfaces of the metal pad 103 that are exposed through the micro-vias 201. In one embodiment, the copper seed layer 106 comprises a titanium-copper (Ti/Cu) stack, with the titanium being formed on the metal pad 103 and the passivation layer 104, and with the copper being formed on the titanium. In the titanium-copper stack, the titanium serves as a barrier layer and the copper serves as an electroplating seed.

Figure 4:
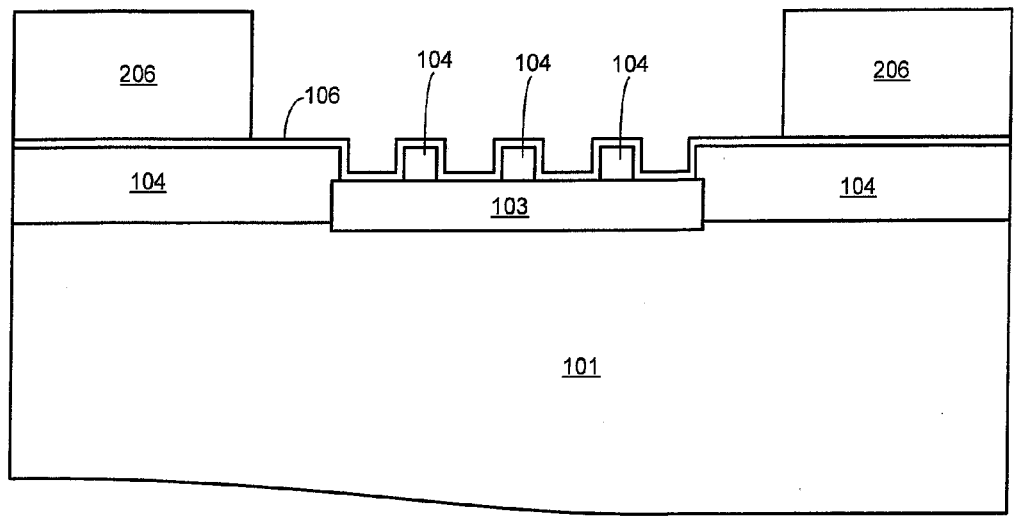

In the example of FIG. 4, a plating mask 206 is formed on the copper seed layer 106. The plating mask 206 may comprise a photoresist material. The plating mask 206 defines the regions where the redistribution layers 109 are to be formed. In the example of FIG. 4, the plating mask 206 exposes the portions of the copper seed layer 106 where the redistribution layers 109 will be electroplated; the plating mask 206 masks other portions.

Figure 5:
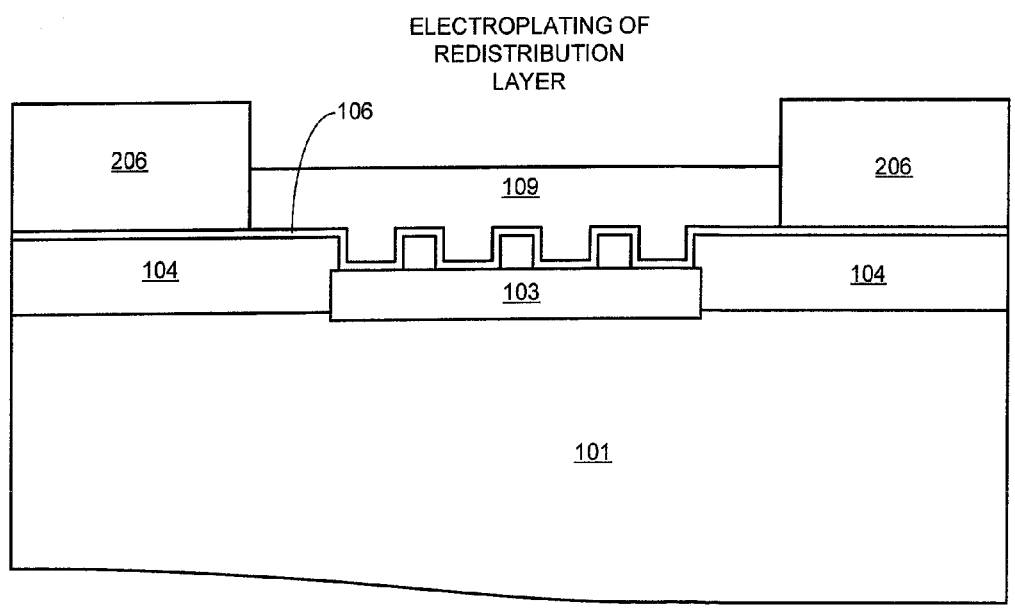
Figure 6:
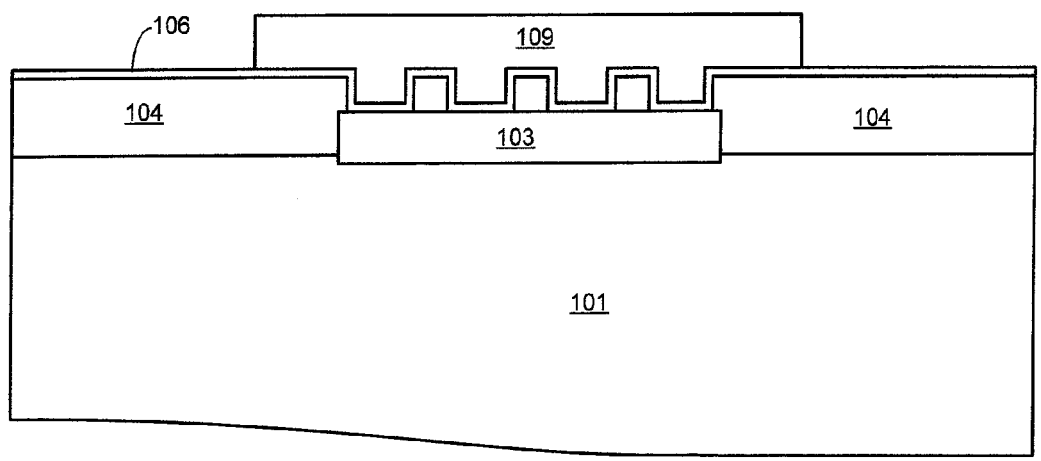

In the example of FIG. 5, the redistribution layers 109 are formed by electroplating copper to the seed layer 106 using the plating mask 206 as a mask. The plating mask 206 is thereafter removed as shown in the example of FIG. 6. The plating mask 206 may be removed in a photoresist strip process.

Figure 7:
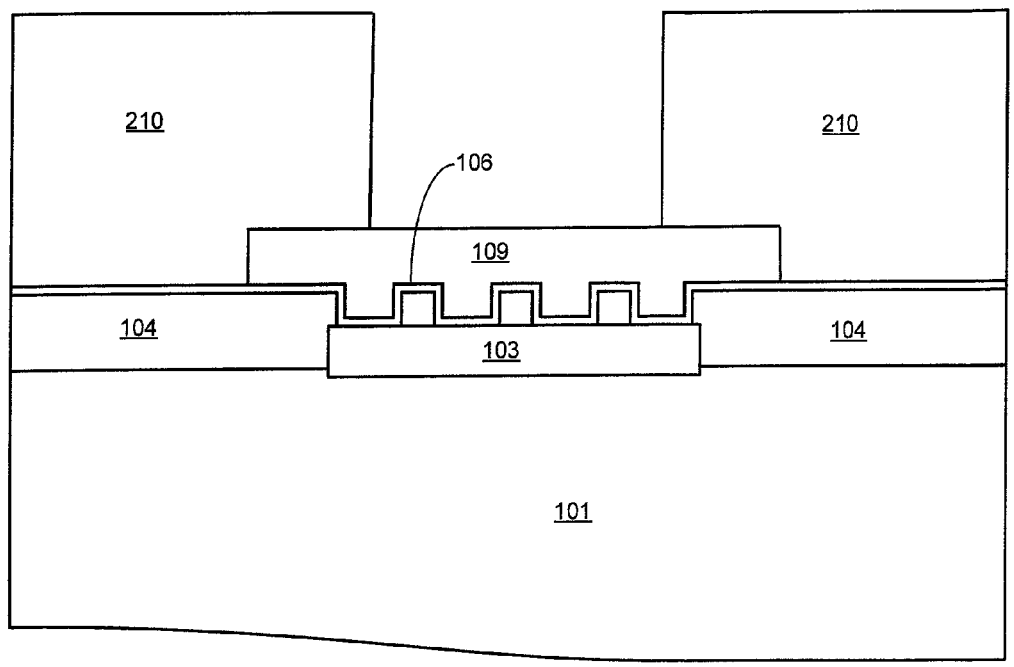

In the example of FIG. 7, a plating mask 210 is formed on the redistribution layers 109 and on the copper seed layer 106. The plating mask 210 may comprise a photoresist material. The plating mask 210 defines the regions where the copper pillars 102 and the solder bumps 105 are to be formed. In the example of FIG. 7, the mask 210 exposes the portions of the redistribution layers 109 where copper is to be electroplated to form the copper pillars 102; the mask 210 masks other portions.

Figure 8:
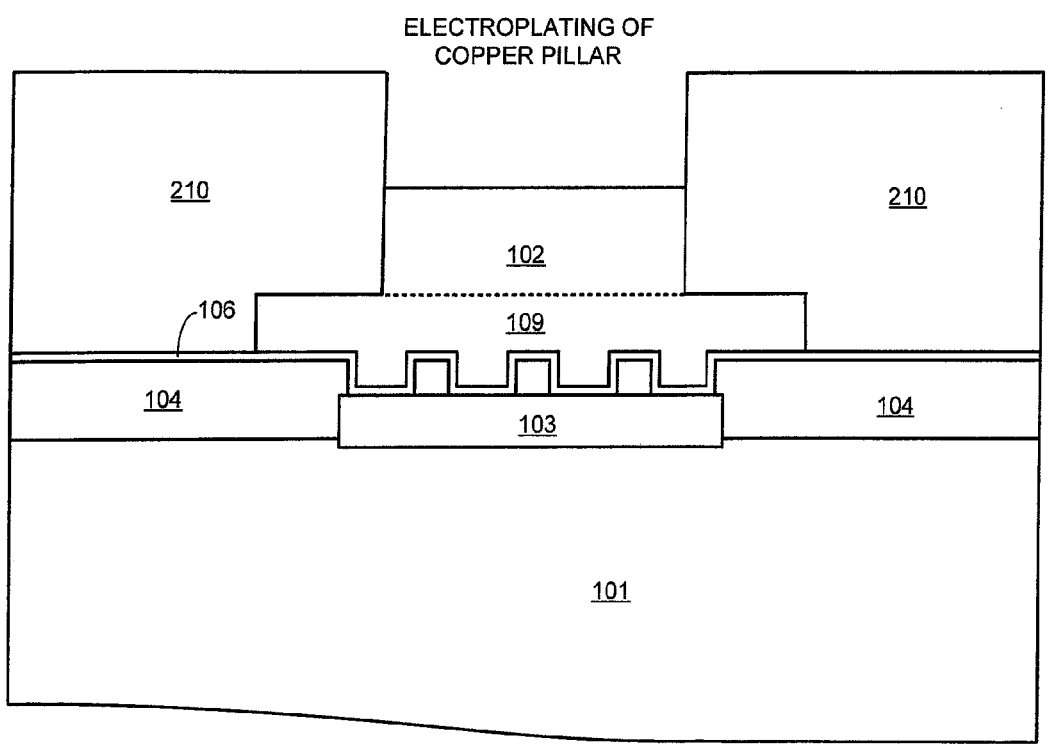
Figure 9:
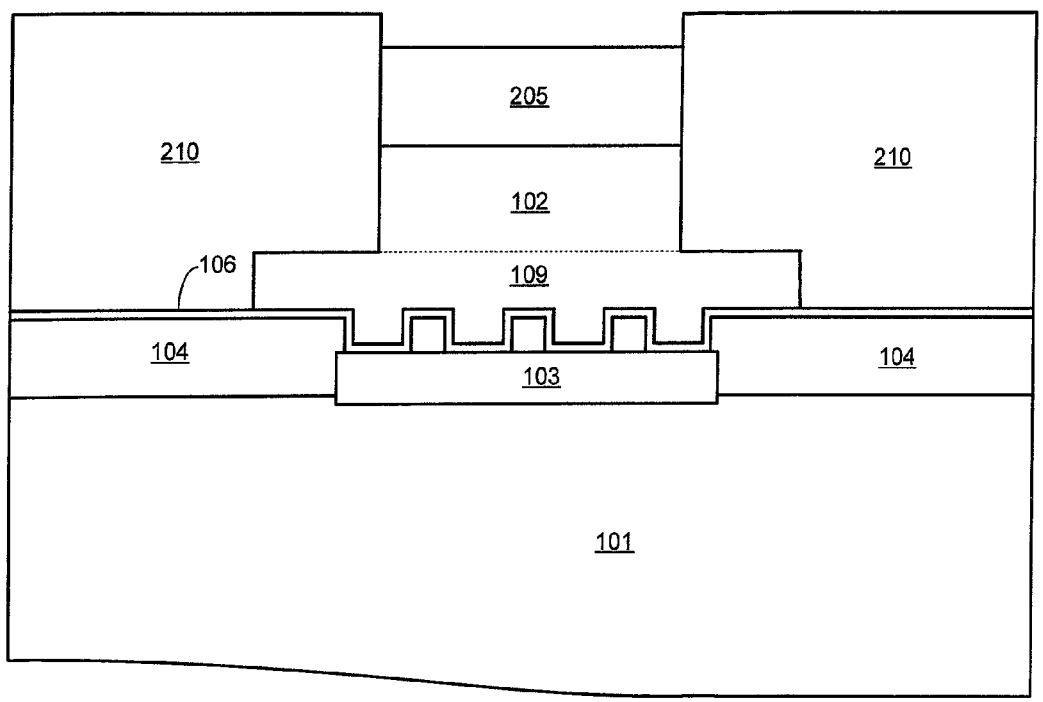

In the example of FIG. 8, the copper pillars 102 are formed by electroplating copper to the redistribution layers 109 using the plating mask 210 as a mask. Thereafter, as shown in the example of FIG. 9, a solder layer 205 is formed by electroplating tin on each copper pillar 102 using the plating mask 210 as a mask. The solder layer 205 may comprise tin (Sn) or tin/silver (Sn/Ag), for example.

Figure 10:
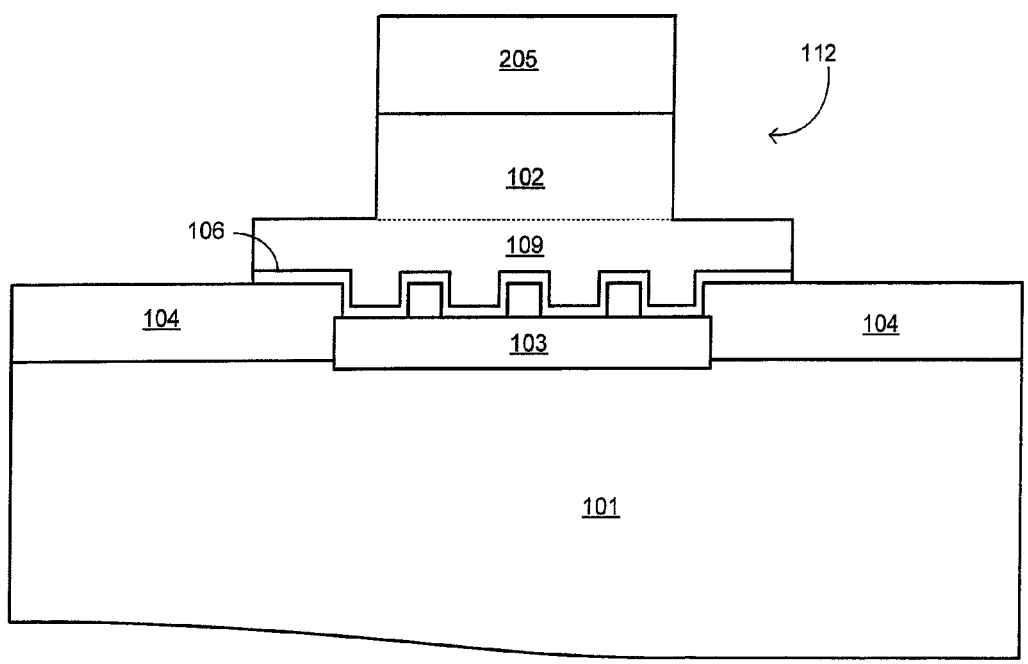

In the example of FIG. 10, the plating mask 210 is removed in a photoresist strip process, for example. The removal of the plating mask 210 exposes the surfaces of the copper structures 112, which each comprises a copper pillar 102 that is formed on a redistribution layer 109. Thereafter, the portions of the copper seed layer 106 that are not under a redistribution layer 109 are removed. The portions of the copper seed layer 106 not under a redistribution layer 109 may be removed in a series of wet etch processes, which may include a copper etch process followed by a titanium etch process to remove the copper and titanium of the titanium-copper stack employed as the copper seed layer 106.

Figure 11:
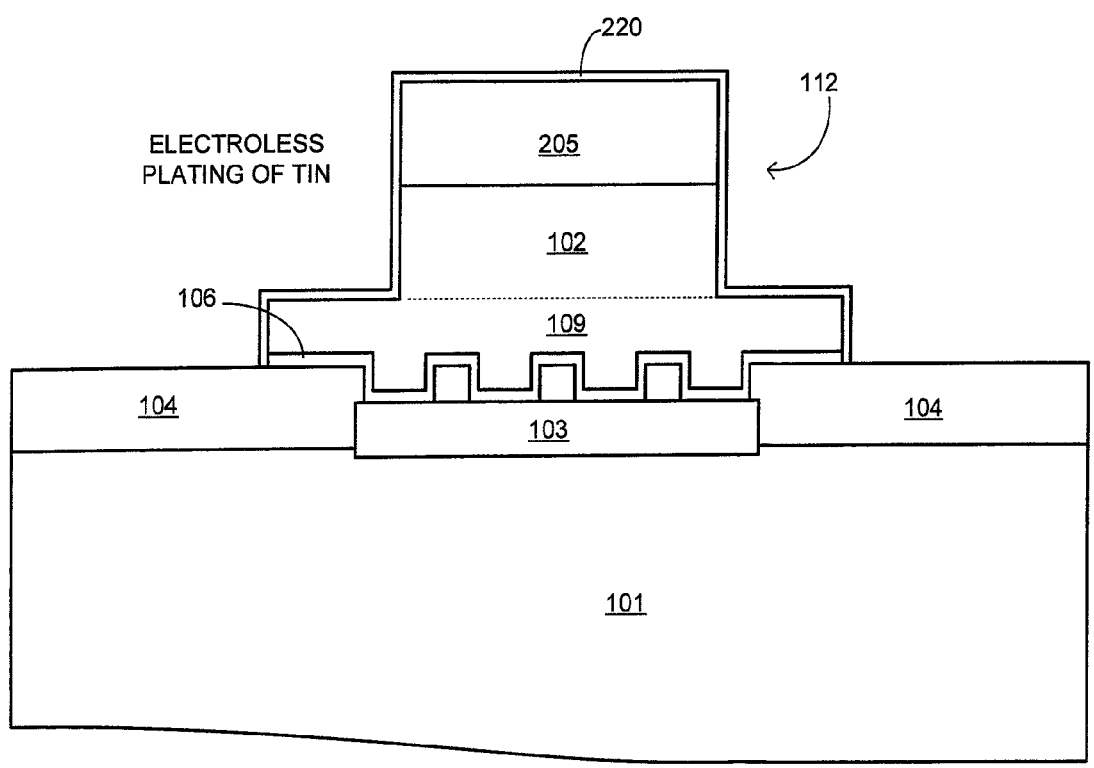

In the example of FIG. 11, tin is plated on all exposed metal surfaces of the sample of FIG. 10 to form a tin coating 220 that covers surfaces of a copper structure 112 and a solder layer 205 disposed on the copper structure 112. That is, in the example of FIG. 11, tin is plated on the surfaces of the solder layer 205, the copper pillar 102, the redistribution layer 109, and the copper seed layer 106. In one embodiment, the tin coating 220 is formed by electroless plating. In contrast to electroplating, electroless plating is a chemical process that does not require having a conductive (metal) seed layer and does not involve running an electric current in the plating bath. Electroless plating allows tin to be plated only on metal surfaces, and not on the passivation layer 104 and other dielectrics. The tin coating 220 may be electroless plated to a thickness of about 500 A to 3000 A, for example.

Figure 12:
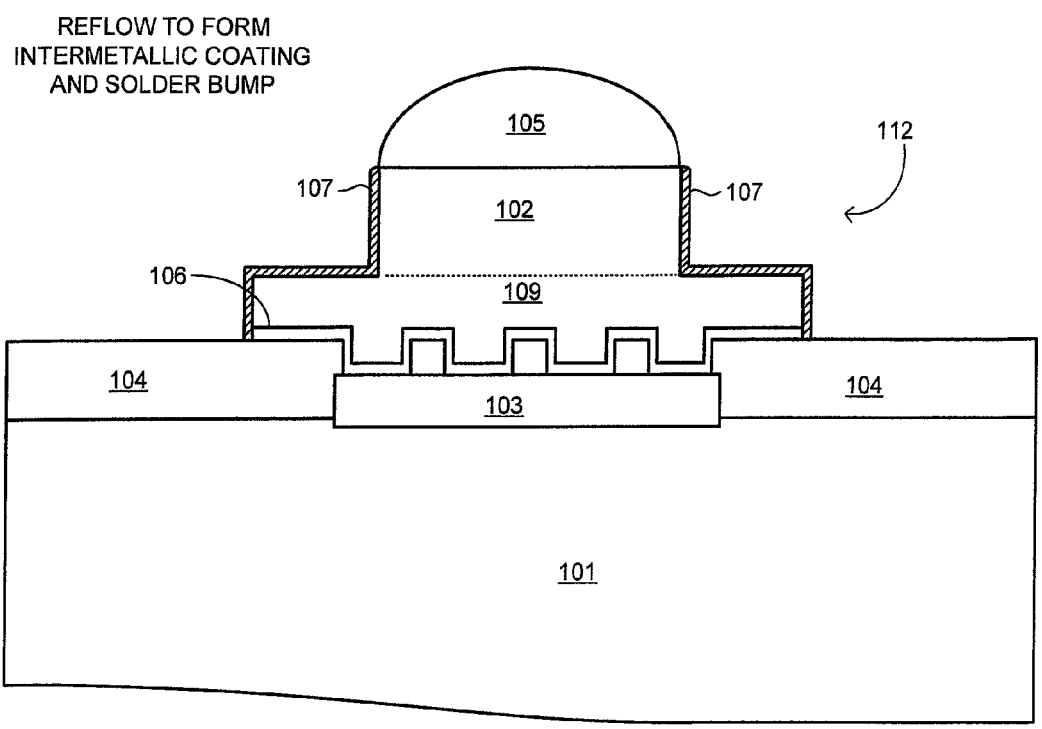

In the example of FIG. 12, the sample of FIG. 11 is subjected to thermal treatment (i.e., heated) to form the intermetallic coating 107 and the solder bump 105. In one embodiment, the intermetallic coating 107 and the solder bump 105 are formed in a reflow process. The reflow process may involve placing the sample of FIG. 11 in a reflow oven or other furnace and then subjecting the sample to a thermal profile that reflows the tin coating 220 and the solder layer 205, which in this example also comprises tin. The heat involved in the reflow process causes the tin coating 220 to combine with the solder layer 205 and form the solder bump 105.

In the example of FIG. 12, the heat involved in the reflow process also causes the copper of the copper structure 112 (i.e., the copper of the copper seed layer 106, the redistribution layer 109, and the copper pillar 102) to react with the tin of the tin coating 220, thereby forming a tin-copper intermetallic coating 107. The intermetallic coating 107 may comprise Cu3Sn, for example. The reaction to form the intermetallic coating 107 consumes the tin coating 220.

The reflow process may also involve fluxing, such as a dry reflow with forming gas or wet reflow with liquid flux. A flux clean process may be performed after the reflow process.

Figure 13A:
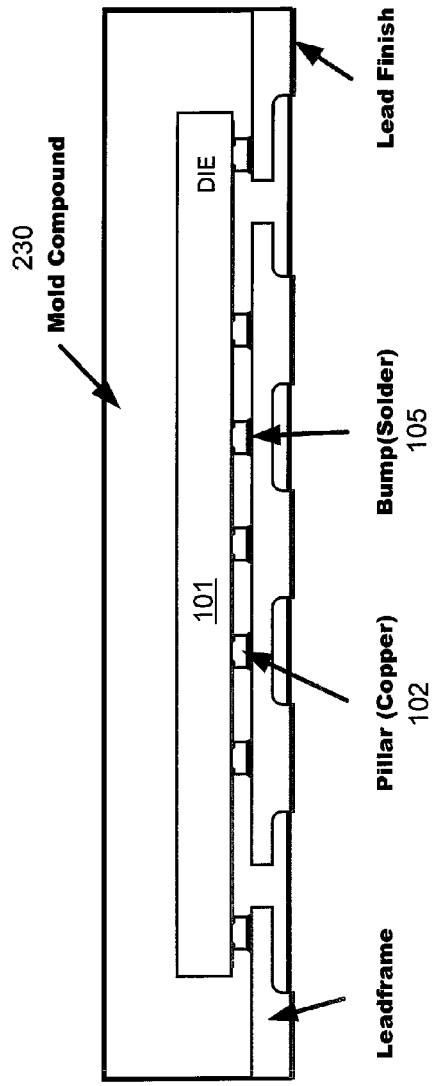
FIGS. 13A and 13B show the IC chip of FIG. 1 in example packages.
Figure 13B:
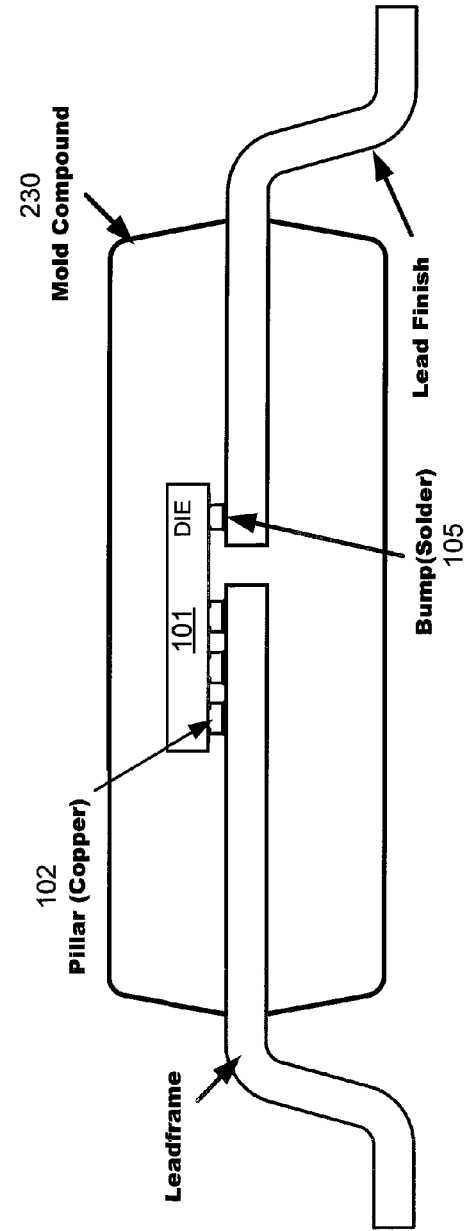

In the example of FIGS. 13A and 13B, the IC chip 100 is encapsulated in a mold 230 in a packaging process. The mold 230 may comprise a molding compound or molding resin. FIG. 13A shows the IC chip 100 as packaged with a leadframe, whereas FIG. 13B shows the IC chip 100 in a leaded package. In both cases, the IC chip 100 is electrically connected to leadframes bay way of solder bumps 105 and copper pillars 102. An external electrical circuit may be electrically connected to the IC chip 100 by way of the leadframes.

Figure 14:
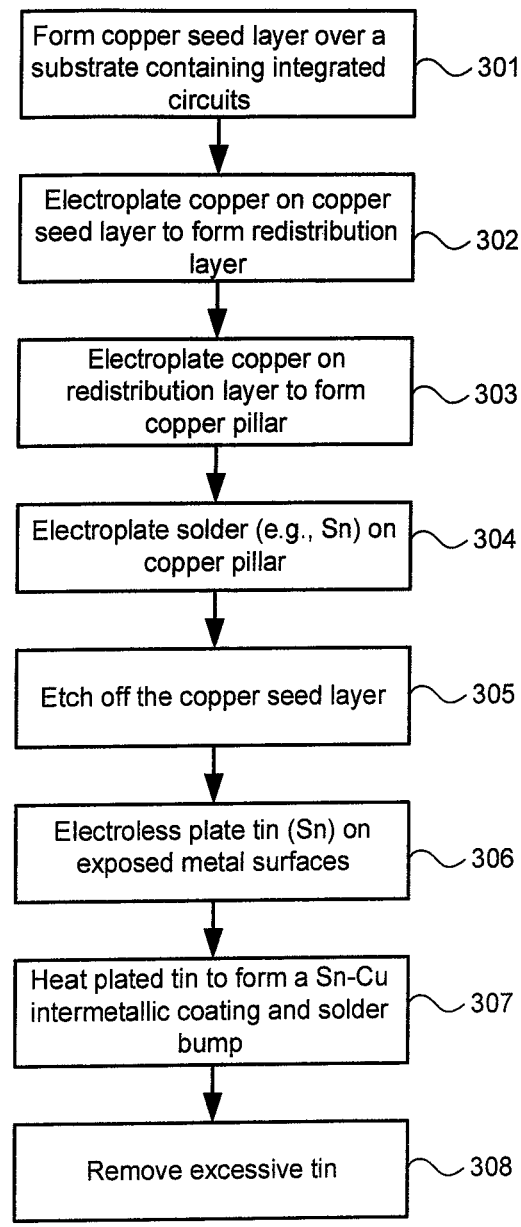
FIG. 14 shows a flow diagram of a method of manufacturing an IC chip in accordance with an embodiment of the present invention.

FIG. 14 shows a flow diagram of a method of manufacturing an IC chip in accordance with an embodiment of the present invention. The method of FIG. 14 may be performed during flip-chip bumping of the wafer, for example. The method of FIG. 14 is explained in the context of FIGS. 1-12 and illustrates the manufacture of a tin/copper pillar bumped flip-chip die. As can be appreciated, the method of FIG. 14 may also be employed in the manufacture of IC chips in general.

In the example of FIG. 14, a copper seed layer is formed over a substrate of an IC chip (step 301). The substrate may include previously formed integrated circuits, such as electrical circuits for DC-DC converters, microcontrollers, etc. In one embodiment, the copper seed layer is formed on a passivation layer and on exposed surfaces of a metal pad. The copper seed layer may comprise a titanium/copper stack. A plurality of vias may be formed through the passivation layer to expose the metal pad. In one embodiment, the passivation layer comprises silicon nitride and the metal pad comprises aluminum. The metal pad may comprise an I/O pad or bond pad that is electrically connected to an electrical circuit in the substrate.

Copper may be electroplated on the copper seed layer to form a redistribution layer (or other metal layer) that electrically connects to the metal pad (step 302). Copper may thereafter be electroplated on the redistribution layer to form a copper pillar (step 303). The redistribution layer and the copper pillar may be formed in separate copper electroplating processes that use different plating masks. The redistribution layer and the copper pillar form a copper structure. Solder is thereafter electroplated on the copper pillar to form a solder layer (step 304). In one embodiment, the solder comprises tin, which is electroplated on the copper pillar using the same plating mask that was employed to electroplate the copper pillar. Portions of the copper seed layer that are not under a redistribution layer are removed, e.g., in an etch process (step 305). The etching of the copper seed layer, which in this example comprises a titanium/copper stack, exposes the passivation layer between copper structures.

In one embodiment, a tin coating is plated on exposed metal surfaces (step 306). The tin coating may be formed by plating tin on the redistribution layer, copper pillar, remaining copper seed layer under the redistribution layer, and solder layer in an electroless plating process. The electroless plating of tin causes tin to form on metal surfaces but not on the passivation layer and other dielectrics.

The tin coating is thereafter heated to form an intermetallic coating on the surfaces of the copper seed layer, redistribution layer, and copper pillar (step 307). The tin coating may be heated in a reflow process that causes tin to react with copper to form the intermetallic coating, which may comprise a tin-copper intermetallic (e.g., Cu3Sn). The reflow process also causes the tin of the tin coating to reflow with the solder layer and form a solder bump. Excessive tin, if any, may be removed from the surface of the intermetallic coating or other surfaces in an optional tin stripping process (step 308).

Copper structures with intermetallic coating and associated methods for manufacturing an IC chip have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of manufacturing an integrated circuit (IC) chip, the method comprising:
    forming a copper seed layer over a substrate, the copper seed layer being formed to electrically connect to a metal pad that electrically connects to an integrated circuit in the substrate;
    electroplating a first copper layer on the copper seed layer;
    electroplating a second copper layer on the first copper layer;
    electroplating solder on the second copper layer;
    electroless plating a coating of tin on a surface of the first copper layer, the second copper layer, and the solder; and
    heating the coating of tin to form a tin-copper intermetallic coating on the surface of the first copper layer and the second copper layer.

2. The method of claim 1, wherein the metal pad comprises an input/output pad of the IC chip.

3. The method of claim 2, wherein the second copper layer comprises a redistribution layer that electrically connects to the input/output pad of the IC chip.

4. The method of claim 3, wherein the second copper layer comprises a copper pillar that electrically connects to the redistribution layer.

5. The method of claim 1, wherein the copper seed layer is formed on a passivation layer.

6. The method of claim 5, wherein the passivation layer comprises a plurality of micro-vias formed on the metal pad.

7. The method of claim 5, wherein the passivation layer comprises silicon nitride.

8. The method of claim 1, wherein heating the coating of tin comprises: reflowing the solder in a reflow process to form a solder bump.

* * * * *